US009252237B2

(12) United States Patent
Doornbos et al.

(10) Patent No.: US 9,252,237 B2
(45) Date of Patent: Feb. 2, 2016

(54) TRANSISTORS, SEMICONDUCTOR DEVICES, AND METHODS OF MANUFACTURE THEREOF

(75) Inventors: Gerben Doornbos, Leuven (BE); Richard Oxland, Leuven (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 378 days.

(21) Appl. No.: 13/604,510

(22) Filed: Sep. 5, 2012

(65) Prior Publication Data

US 2014/0061722 A1    Mar. 6, 2014

(51) Int. Cl.
| H01L 21/44 | (2006.01) |
| H01L 21/28 | (2006.01) |
| H01L 21/3205 | (2006.01) |
| H01L 29/66 | (2006.01) |
| H01L 21/18 | (2006.01) |
| H01L 29/786 | (2006.01) |

(52) U.S. Cl.
CPC ........ *H01L 29/66545* (2013.01); *H01L 21/182* (2013.01); *H01L 29/78681* (2013.01)

(58) Field of Classification Search
None
See application file for complete search history.

(56) References Cited

U.S. PATENT DOCUMENTS

| 6,337,497 B1 | 1/2002 | Hanafi et al. |
| 7,488,631 B2 | 2/2009 | Yagishita |
| 8,067,799 B2 | 11/2011 | Choi |
| 2010/0065824 A1* | 3/2010 | Wang et al. ............... 257/24 |
| 2010/0264485 A1* | 10/2010 | Masuoka et al. ........... 257/329 |
| 2011/0608348 | 3/2011 | Passlack |
| 2011/0121363 A1* | 5/2011 | Cheng et al. ............... 257/190 |
| 2011/0309434 A1* | 12/2011 | Huang et al. ............... 257/326 |
| 2012/0193637 A1* | 8/2012 | Kalnitsky et al. ........... 257/76 |
| 2013/0234205 A1 | 9/2013 | Oxland et al. |
| 2013/0299895 A1 | 11/2013 | Oxland et al. |

FOREIGN PATENT DOCUMENTS

| JP | 2000323703 A | 11/2000 |
| TW | 390035 | 5/2000 |

OTHER PUBLICATIONS

U.S. Appl. No. 13/414,437, filed Mar. 7, 2012, Oxland.
U.S. Appl. No. 13/467,133, filed May 9, 2012, Oxland.
Barnett, J., et al., "Advanced Techniques for Achieving Ultra-Shallow Junctions in Future CMOS Devices," 2010 International Workshop on Junction Technology, 4 pages.
Kim, D.-H., et al., "Scalability of Sub-100 nm InAs HEMTS on InP Substrate for Future Logic Applications," IEEE Transactions on Electron Devices, vol. 57, No. 7, Jul. 2010, pp. 1504-1511.
Kim, SH, et al., "Self-aligned metal source/drain InP n-metal-oxide-semiconductor field-effect transistors using Ni-InP metallic alloy," Applied Physics Letters 98, 243504 (2011), 3 pages.

(Continued)

*Primary Examiner* — Calvin Choi
(74) *Attorney, Agent, or Firm* — Slater & Matsil, L.L.P.

(57) ABSTRACT

Transistors, semiconductor devices and methods of manufacture thereof are disclosed. In one embodiment, a method of manufacturing a semiconductor device includes forming a transistor over a workpiece. The transistor includes a sacrificial gate material comprising a group III-V material. The method includes combining a metal (Me) with the group III-V material of the sacrificial gate material to form a gate of the transistor comprising a Me-III-V compound material.

20 Claims, 11 Drawing Sheets

(56) References Cited

OTHER PUBLICATIONS

Kim, S.H., et al., "Self-aligned metal Source/Drain $In_xGa_{1-x}As$ n-MOSFETs using Ni—InGaAs alloy," IEEE International Electron Devices Meeting, 2010, pp. 26.6.1-26.6.4.

Ma, B. Y., et al., "InAs/AlSb HEMT and Its Application to Ultra-Low-Power Wideband High-Gain Low-Noise Amplifiers," IEEE Transactions on Microwave Theory and Techniques, vol. 54, No. 12, Dec. 2006, pp. 4448-4455.

Oxland, R., et al., "An Ultralow-Resistance Ultrashallow Metallic Source/Drain Contact Scheme for III-V NMOS," IEEE Electron Device Letters, vol. 33, No. 4, Apr. 2012, pp. 501-503.

Qiu, Z., et al., "A Comparative Study of Two Different Schemes to Dopant Segregation at NiSi/Si and PtSi/Si Interfaces for Schottky Barrier Height Lowering," IEEE Transactions on Electron Devices, vol. 55, No. 1, Jan. 2008, pp. 396-403.

Wikipedia, "CMOS," http://en.wikipedia.org/wiki/CMOS, Aug. 15, 2012, 9 pages.

Wittmer, M., et al., "Low-temperature diffusion of dopant atoms in silicon during interfacial silicide formation," Physical Review B, vol. 29, No. 4, Feb. 15, 1984, pp. 2010-2020.

Zhang, X., et al., "$In_{0.7}Ga_{0.3}As$ Channel n-MOSFET with Self-Aligned Ni—InGaAs Source and Drain," Electrochemical and Solid-State Letters, 14 (2) (2011), pp. H60-H62.

Zhang, X., et al., "$In_{0.7}Ga_{0.3}As$ Channel n-MOSFET with a Novel Self-Aligned Ni—InGaAs Contact formed using a Salicide-like Metallization Process," International Symposium on VLSI Technology, Systems and Applications, 2011, 2 pages.

\* cited by examiner

TRANSISTORS, SEMICONDUCTOR DEVICES, AND METHODS OF MANUFACTURE THEREOF

CROSS-REFERENCE TO RELATED APPLICATIONS

This application relates to the following co-pending and commonly assigned U.S. patent applications: Ser. No. 13/542,860, filed on Jul. 6, 2012, entitled, "III-V Compound Semiconductor Device Having Metal Contacts and Method of Making the Same;" and Ser. No. 13/467,133, filed on May 9, 2012, entitled, "III-V compound Semiconductor Device Having Dopant Layer and Method of Making the Same," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components can introduce challenges into manufacturing process flows for semiconductor devices.

Transistors are elements that are fundamental building blocks of electronic systems and integrated circuits (ICs). Transistors are commonly used in semiconductor devices to amplify, switch electronic power, and perform other operations. Some recent designs of transistors include high electron mobility transistors (HEMTs) which have low voltage operation, increased speed, and decreased power dissipation than traditional complementary metal oxide semiconductor (CMOS) devices, and vertical transistors, which have multiple gates.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the manufacture of semiconductor devices. Novel transistors, semiconductor devices, and manufacturing methods thereof will be described herein. Transistors comprising group III-V compound materials are disclosed. The group III materials comprise elements such as B, Al, Ga, In, and Tl on the periodic table of elements. The group V materials comprise elements such as N, P, As, Sb, and Bi on the periodic table of elements. The group III and V materials may also comprise other elements from group III and V, respectively.

FIGS. 1 through 11 show cross-sectional views of a method of manufacturing a transistor 130 (see FIG. 11) of a semiconductor device 100 in accordance with some embodiments of the present disclosure, wherein the gate 120 and source and drain regions 122 comprise metal group III-V (Me-III-V) compound materials. The group III-V materials comprise at least one element from group III of the periodic table of elements. The at least one element from group III of the metal group III-V materials is combined with at least one element from group V of the periodic table.

Figure 1:
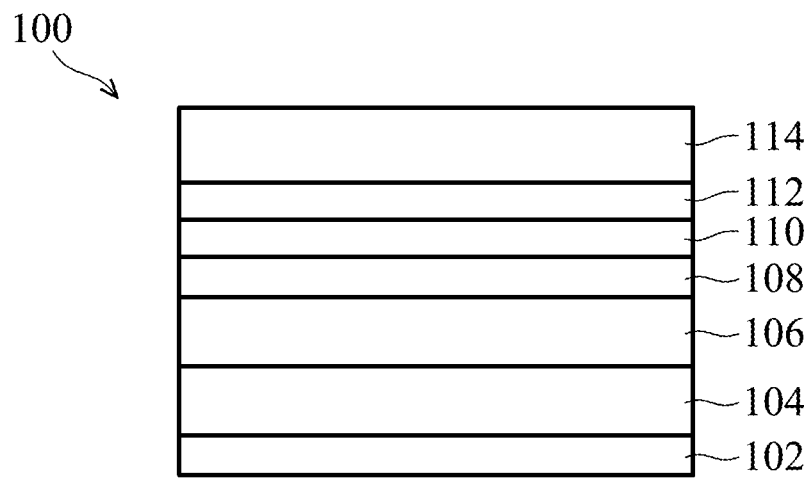
FIGS. 1 through 11 show cross-sectional views of a method of manufacturing a transistor of a semiconductor device in accordance with some embodiments of the present disclosure, wherein the gate, source, and drain comprise metal group III-V (Me-III-V) compound materials.

A manufacturing process flow for manufacturing a transistor 130 comprising an InAs n-channel field effect transistor (NFET) will first be described with reference to FIGS. 1 through 11. FIG. 1 illustrates a cross-sectional view of a material stack 104, 106, 108, 110, 112, and 114 disposed over workpiece 102, to be described further herein, that is used to form the transistor 130. The various materials of the material stack 104, 106, 108, 110, 112, and 114, and also subsequently deposited materials to be described herein, are each formed over a workpiece 102 using molecular beam epitaxy (MBE), chemical vapor deposition (CVD), plasma-enhanced CVD (PECVD), metal organic CVD (MOCVD), atomic layer deposition (ALD), or other methods in some embodiments. The semiconductor device 100 comprises a complementary metal oxide semiconductor (CMOS) device or other types of devices in some embodiments.

The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 comprises Si or a compound semiconductor such as InAs or GaSb in some embodiments, as examples. Alternatively, the workpiece 102 may comprise other materials.

A template layer 104 is formed over the workpiece 102, also shown in FIG. 1. The template layer 104 comprises a buffer layer comprising a group III-V compound semiconductor material in some embodiments. The template layer 104 may comprise InAs or GaSb, as examples. The template layer 104 comprises a thickness of about 200 nm, for example. The template layer 104 may alternatively comprise other materials and dimensions.

An insulating material 106 is formed over the template layer 104. The insulating material 106 comprises a group III-V compound semiconductor material as described above for the template layer 104 in some embodiments. The insulating material 106 may comprise a wide bandgap insulator comprising AlAsSb having a thickness of about 100 nm, as an example. The insulating material 106 may alternatively comprise other materials and dimensions.

A channel material 108 is formed over the insulating material 106. A portion of the channel material 108 will later function as a channel of the transistor 130. Other portions of the channel material 108 will function as a sacrificial material that is used to form source and drain regions 122 (see FIG. 9) of the transistor 130 in some embodiments. The channel material 108 comprises a group III-V compound semiconductor material in some embodiments. The channel material 108 comprises InAs having a thickness of about 4 to 20 nm, as an example. The channel material 108 may alternatively comprise other materials and dimensions.

Referring again to FIG. 1, a barrier material 110 is formed over the channel material 108. A portion of the barrier material 110 will function as a barrier of the transistor 130. The barrier material 110 comprises a wide bandgap barrier and functions as a barrier between the channel and a gate 120 (see FIG. 9) of the transistor 130. The barrier material 110 comprises a high dielectric constant (k) dielectric material having a k value higher than a k value of silicon dioxide, $HfO_2$, $Ga_2O_3$, ZnTeSe, or combinations or multiple layers thereof in some embodiments. The barrier material 110 comprises a thickness of about 1 to 10 nm, as an example. The barrier material 110 may alternatively comprise other materials and dimensions.

A first sacrificial gate material 112 is formed over the barrier material 110. The first sacrificial gate material 112 comprises a group III-V material in accordance with some embodiments. The first sacrificial gate material 112 comprises a semiconductive material such as InGaAs or InAs having a thickness of about 10 to 100 nm, as an example. The first sacrificial gate material 112 may alternatively comprise other materials and dimensions.

A second sacrificial gate material 114 is formed over the first sacrificial gate material 112. The second sacrificial gate material 114 comprises a semiconductive material in some embodiments. The second sacrificial gate material 114 comprises polysilicon in some embodiments, as an example. The second sacrificial gate material 114 comprises a thickness of about 40 to 100 nm in some embodiments, as an example. Alternatively, the second sacrificial gate material 114 may comprise other materials and dimensions.

Figure 2:
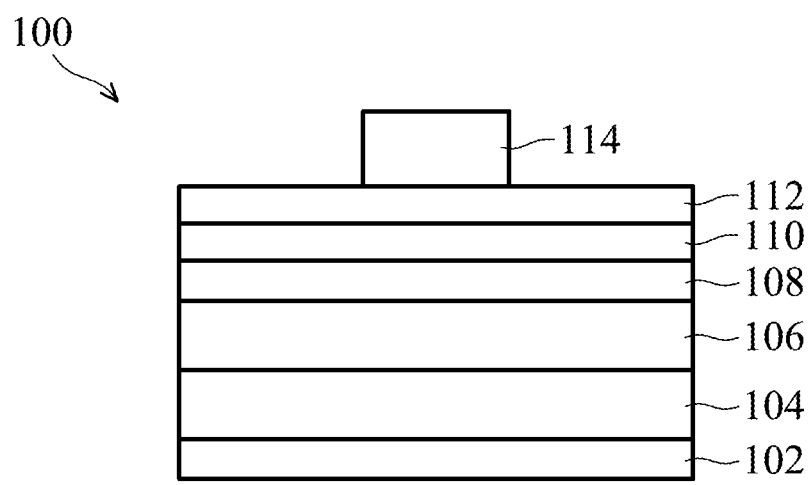

The second sacrificial gate material 114 is patterned, as shown in FIG. 2. The shape of the patterned second sacrificial gate material 114 comprises a desired shape for a gate 120 of the transistor 130, which may be rectangular in a top view, for example. Alternatively, the patterned second sacrificial gate material 114 may comprise other shapes. The second sacrificial gate material 114 is patterned using lithography, by forming a layer of photoresist (not shown) over the second sacrificial gate material 114, patterning the layer of photoresist by exposing the layer of photoresist to light or energy reflected from or transmitted through a lithography mask having a desired pattern thereon, and developing the layer of photoresist. Portions of the layer of photoresist are ashed or etched away, and the layer of photoresist is used as an etch mask during the patterning of the second sacrificial gate material 114. Alternatively, the second sacrificial gate material 114 may be directly patterned.

Figure 3:
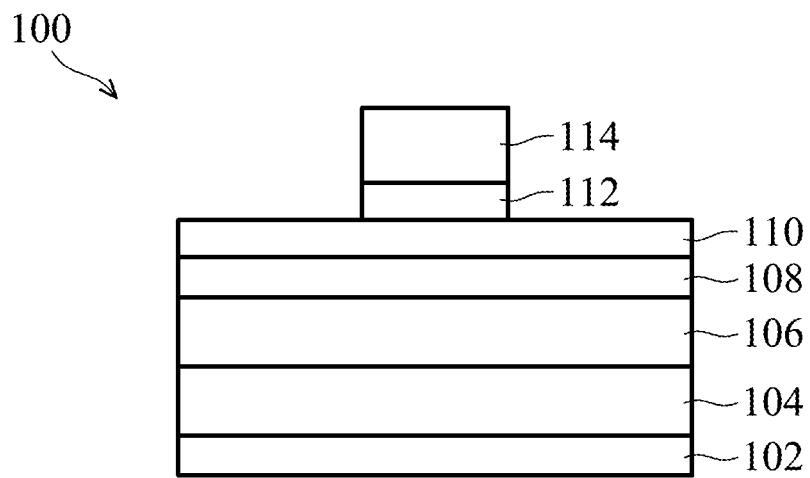
Figure 4:
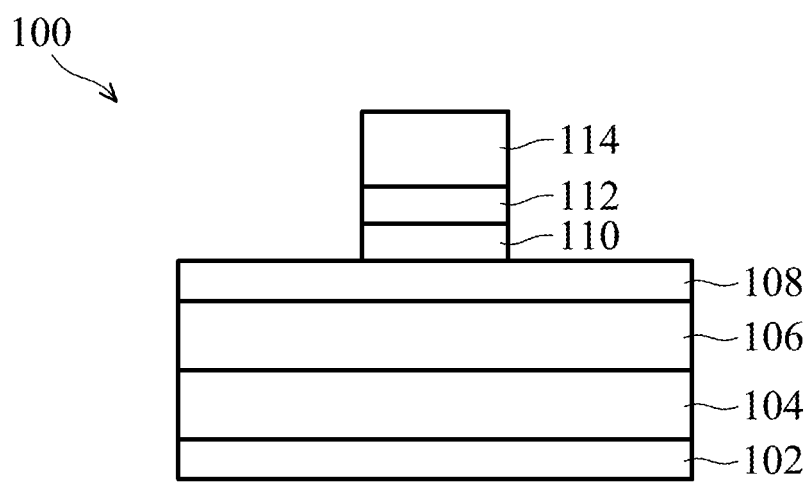

The first sacrificial gate material 112 is then patterned, as shown in FIG. 3. The first sacrificial gate material 112 is etched using a selective etch process in some embodiments, for example. Alternatively, other types of etch processes may be used. The barrier material 110 is then patterned, as shown in FIG. 4. The barrier material 110 is etched using a selective etch process in some embodiments, although alternatively, other types of etch processes may also be used. The first sacrificial gate material 112 and the barrier material 110 comprise substantially the same shape as the second sacrificial gate material 114 after the respective etch processes, for example. The barrier material 110 left remaining functions as the barrier 110 of the transistor 130. The first sacrificial gate material 112 is used to form the novel gate 120 of the transistor 130 comprising a Me-III-V compound material, to be described further herein.

It should be noted that the particular etch chemistries for the various material layers are not described in detail herein. Etch chemistries are used for the various layers depending on the type of material being etched, which are familiar to those skilled in the art, for example.

Figure 5:
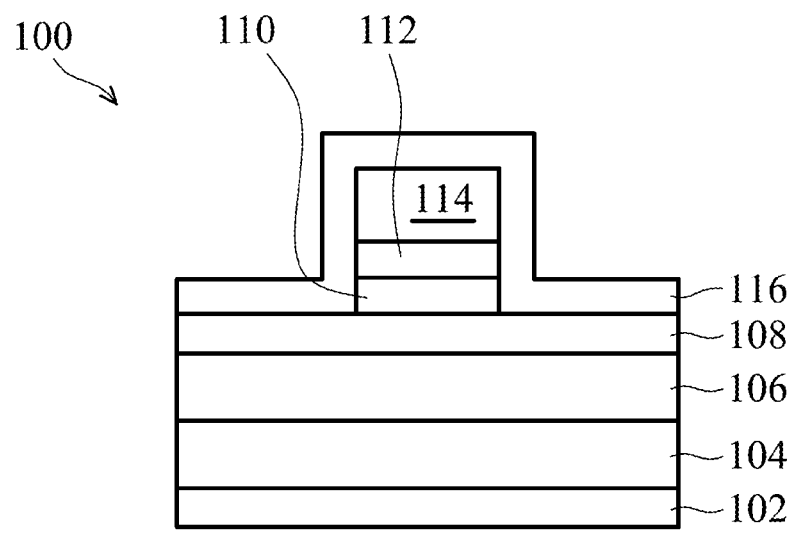

A spacer material 116 is then formed over the patterned second sacrificial gate material 114, the patterned first sacrificial gate material 112, and the patterned barrier material 110, as shown in FIG. 5. The spacer material 116 comprises $SiO_2$, $Si_3N_4$, or combinations or multiple layers thereof, having a thickness of about 4 to 40 nm, as examples. Alternatively, the spacer material 116 may comprise other materials and dimensions.

Figure 6:
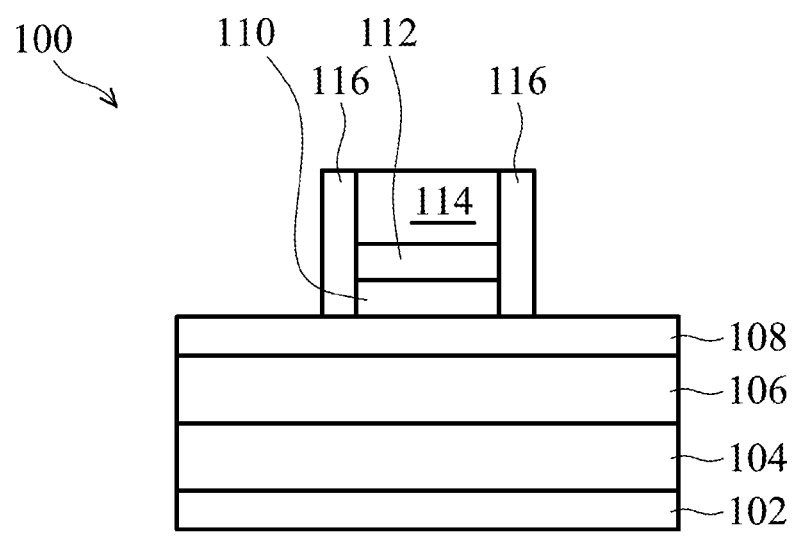

The spacer material 116 is patterned to form sidewall spacers 116 on the sidewalls of the patterned second sacrificial gate material 114, on the sidewalls of the patterned first sacrificial gate material 112, and on the sidewalls of the patterned barrier material 110, as shown in FIG. 6. The etch process for the spacer material 116 may comprise an anisotropic etch process that is adapted to remove more of the spacer material 116 from top surfaces of the second sacrificial gate material 112 and the channel material 108 relative to the removal of the spacer material 116 on the sidewalls of the patterned second sacrificial gate material 114, the patterned first sacrificial gate material 112, and the patterned barrier material 110, for example.

Figure 7:
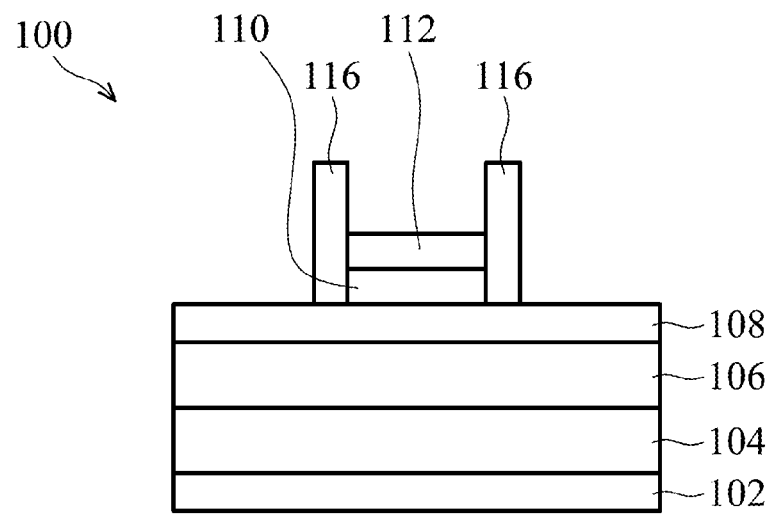

The second sacrificial gate material 114 is then removed, as shown in FIG. 7, exposing the top surface of the first sacrificial gate material 112.

Figure 8:
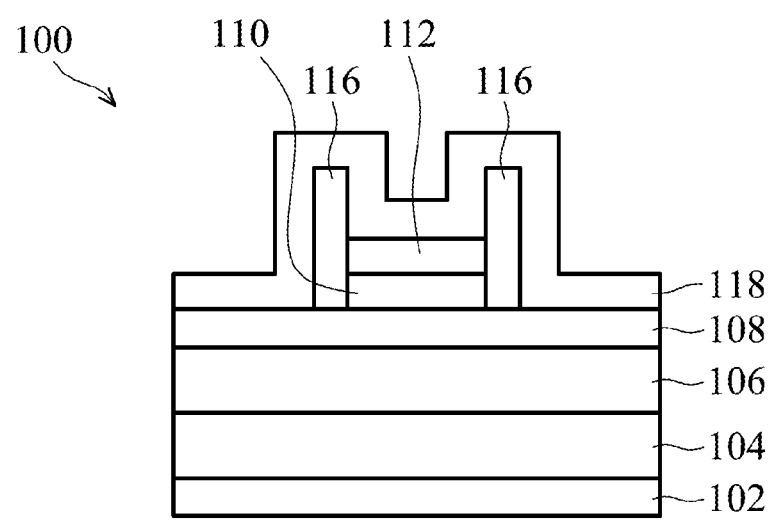

A metal layer 118 is formed over the channel material 108, the sidewall spacers 116, and the top surface of the first sacrificial gate material 112, as shown in FIG. 8. The metal layer 118 comprises a metal (Me). The metal layer 118 comprises Ni, Pt, Pd, Co, or combinations or multiple layers thereof in some embodiments. The metal layer 118 comprises a thickness of about 5 nm to about 200 nm, as examples. Alternatively, the metal layer 118 may comprise other materials and dimensions.

Figure 9:
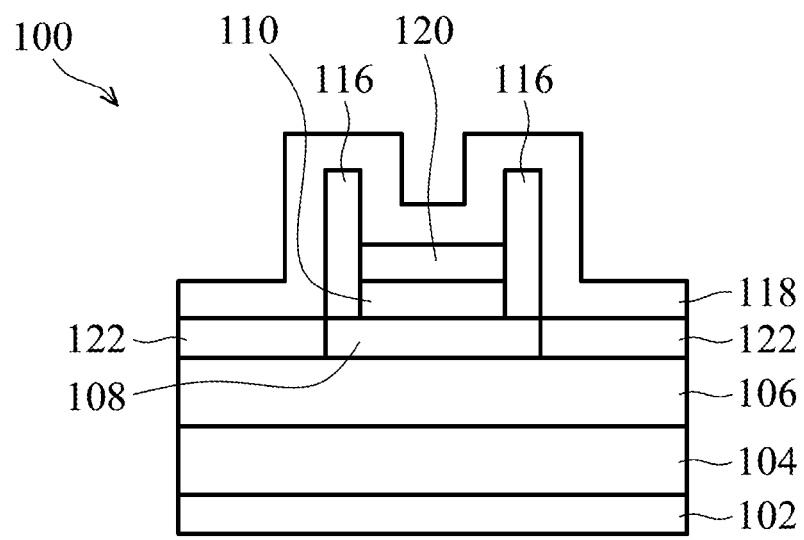

The workpiece 102 is then heated, as shown in FIG. 9. The workpiece 102 is heated using an anneal process in some embodiments, although alternatively, other methods of heating the workpiece 102 may be used. The workpiece 102 is heated to a temperature of about 250 to about 500 degrees C. in some embodiments, although alternatively, other temperatures may be used. The anneal process may comprise a single step process or a multiple step process at two or more different temperatures, as examples.

Heating the workpiece 102 causes the metal (Me) in the metal layer 118 to combine with the material of the first sacrificial gate material 112 and form a gate 120 comprising a Me-III-V compound material, as shown in FIG. 9. The Me-III-V compound material of the gate 120 comprises Me-InGaAs or Me-InAs in some embodiments.

Heating the workpiece 102 also causes the metal (Me) in the metal layer 118 to combine with the material of the channel material 108 and form a source region and a drain region 122 comprising a Me-III-V compound material. The Me-III-V compound material of the source region and the drain region 122 comprises Me-InAs in some embodiments. The unreacted channel material 108 disposed beneath the barrier 110 comprises a channel 108 of the transistor 130. In embodiments wherein the metal of the metal layer 118 comprises Ni, the gate 120 is fully converted into the Ni-III-V compound material ("nickelided"), in some embodiments, and the gate 120 comprises Ni—InGaAs or Ni—InAs, for example. The Me-III-V compound materials of the gate 120 and source and drain regions 122 after the anneal process comprise a crystalline metal material in some embodiments, as another example. Alternatively, the materials of the gate 120 and source and drain regions 122 may comprise other materials, depending on the materials of the first sacrificial gate material 112 and the channel material 108.

The anneal process is halted before a metal (Me) of the metal layer 118 diffuses into the barrier 110, in some embodiments.

Figure 10:
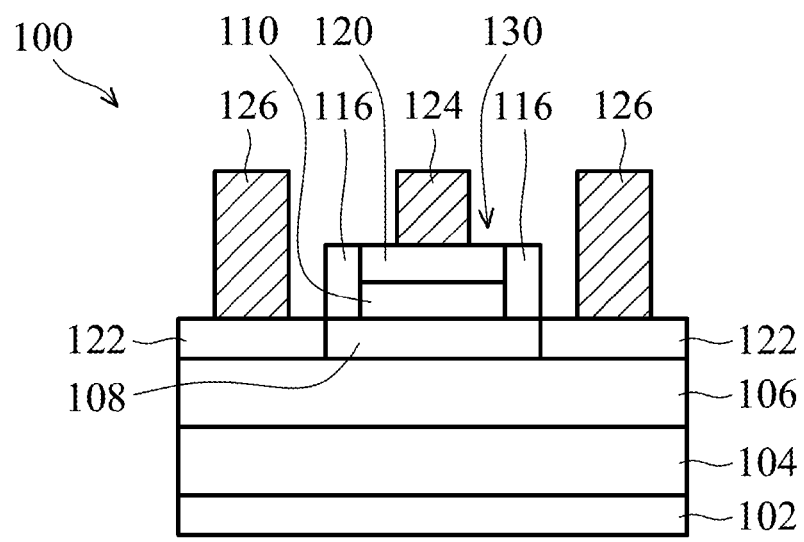
Figure 11:
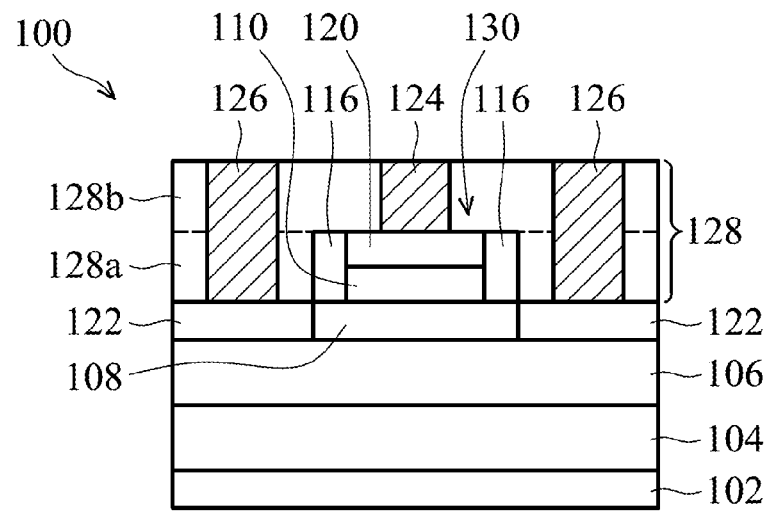

The metal layer 118 is then removed, as shown in FIG. 10, and the sidewall spacers are planarized using a chemical mechanical polishing (CMP) process. A transistor 130 is formed that comprises the gate 120, the barrier 110, the channel 108, and the source and drain regions 122. A gate contact 124 is coupled to the gate 120, and source and drain contacts 126 are coupled to the source and drain regions 122, respectively. The contacts 124 and 126 may comprise tungsten (W) and titanium nitride (TiN) in some embodiments, as an example, although alternatively, the contacts 124 and 126 may comprise other materials. The contacts 124 and 126 are formed within a subsequently deposited insulating material layer 128, as shown in FIG. 11.

As one example, a first insulating material layer 128a may be formed over the sidewall spacers 116 shown in FIG. 9 after the removal of the metal layer 118, and the first insulating material layer 128a and the sidewall spacers 116 may be planarized using a CMP process until the gate 120 top surface is reached. A second insulating material layer 128b is then formed over the first insulating material layer 128a and exposed top surfaces of the gate 120 and the sidewall spacers 116. The first and second insulating material layers 128a and 128b may then be patterned using lithography, and using a damascene process, a conductive material is then formed over the patterned insulating material layer 128 comprising the first and second insulating material layers 128a and 128b. Any excess conductive material is then removed using another CMP process leaving the contacts 124 and 126 disposed within the insulating material layer 128, forming the structure shown in FIG. 11. Alternatively, the conductive material may be plated onto gate 120 and source and drain regions 122 to form contacts 124 and 126, and an additional CMP process may not be required, as another example.

The contacts 124 and 126 may alternatively be formed using materials and methods described in U.S. patent application Ser. No. 13/542,860, filed on Jul. 6, 2012, entitled, "III-V Compound Semiconductor Device Having Metal Contacts and Method of Making the Same," for example, which is incorporated herein by reference.

In the embodiments previous described herein with reference to FIGS. 1 through 11, examples of materials for the various material layers were shown for an InAs NFET device. Table 1 illustrates combinations of materials that may be used for the transistors 130 described herein for various transistor material systems, as examples, and in accordance with some embodiments. Alternatively, other combinations of materials may be used for the various elements.

TABLE 1

| Element No. | Material system | InAs (NFET) | InP (NFET) | III-Sb (PFET) |
|---|---|---|---|---|
| 102 | workpiece | Si, InAs, or GaSb | Si, InP | Si, InAs, or GaSb |
| 104 | template layer | InAs or GaSb | InP | InAs or GaSb |
| 106 | insulating material | AlAsSb | InAlAs | AlAsSb |
| 108 | channel | InAs | InGaAs or InAs | InGaSb or InAsSb |
| 110 | barrier | high-K material, $HfO_2$, $ZrO_2$, $Al_2O_3$, $Ga_2O_3$, or ZnTeSe | | |
| 112 | first sacrificial gate material | InGaAs or InAs | InGaAs or InAs | InGaAs or InAs |
| 114 | second sacrificial gate material | Polysilicon | | |
| 116 | sidewall spacers | $SiO_2$ or $Si_3N_4$ | | |
| 118 | metal layer including a metal (Me) | Ni, Pt, Pd, or Co | | |
| 120 | gate material | Me—InGaAs or Me—InAs | Me—InGaAs or Me—InAs | Me—InGaAs or Me—InAs |
| 122, 122', or 122" | source region and drain region material | Me—InAs | Me—InGaAs or Me—InAs | Me—InAs |

As another example, the manufacturing process flow described for FIGS. 1 through 11 may be used to manufacture an InP NFET device. Some materials for the various material layers are listed in Table 1 for a materials system for an InP NFET device, using the process flow shown in FIGS. 1 through 11. Alternatively, other materials may be used.

Figure 12:
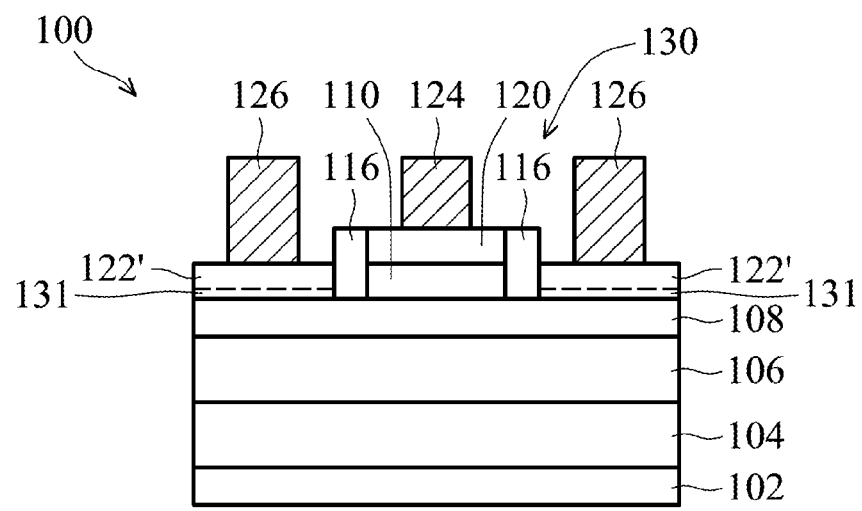
FIG. 12 is a cross-sectional view of a transistor of a semiconductor device in accordance with some embodiments.

Table 1 also lists exemplary materials for the various element numbers that can be used to manufacture a III-Sb PFET device. FIG. 12 is a cross-sectional view of a transistor 130 comprising a III-Sb PFET of a semiconductor device 100 in accordance with some embodiments, wherein the source and drain regions 122' are not formed from the channel material 108, as in the previous embodiments described herein. Rather, the channel material 108 comprises a material that does not form a compound material or combine with the metal (Me) of the metal layer 118 shown in FIG. 9.

To form source and drain regions 122' comprising a Me-III-V compound material, before the metal layer 118 is deposited, a III-V material 131 that is combinable with the metal (Me) of the metal layer 118 is formed over the exposed channel material 108, as shown in phantom in FIG. 12. The III-V material 131 may be grown using a selective epitaxial growth process in some embodiments, for example. The channel material 108 may be recessed before the epitaxial growth process, or the channel material 108 may not be recessed before the epitaxial growth process. The III-V material 131 comprises InAs in some embodiments, as an example. Alternatively, the III-V material 131 may comprise other materials formed using other methods.

Figure 19:
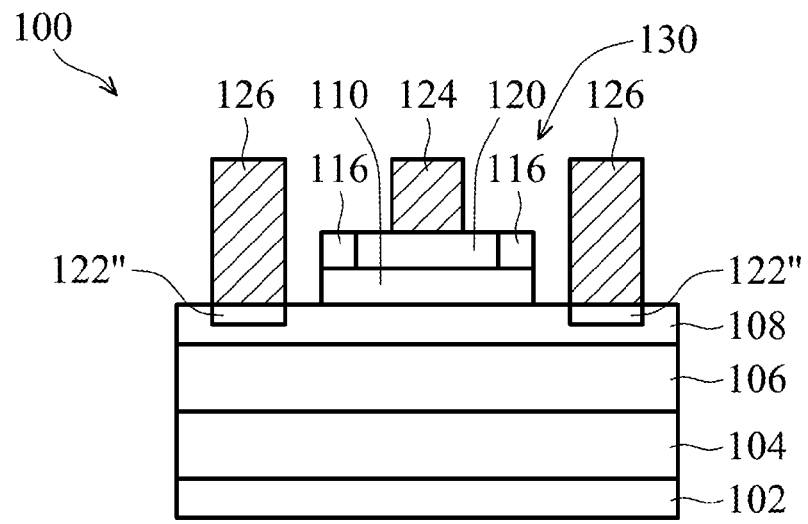

The III-V material 131 deposition or formation process may not be adapted to form the III-V material 131 on top surfaces of the sidewall spacers 116 or the first sacrificial gate material 112 in some embodiments. In other embodiments, a small amount of the III-V material 131 may also form on the top surface of the first sacrificial gate material 112, not shown. The manufacturing process flow described with reference to the embodiments shown in FIGS. 8 through 10 is then performed, forming the transistor 130 shown in FIG. 12. After the metal layer 118 is formed over the semiconductor device 100 as shown in FIG. 19 and the workpiece 102 is heated, the III-V material 131 combines with the metal Me of the metal layer 118 and forms source and drain regions 122' comprising a Me-III-V compound material. In embodiments wherein the III-V material 131 comprises InAs, the source and drain region 122' comprise Me-InAs, for example. The source and drain regions 122' may alternatively comprise other materials.

FIGS. 13 through 19 are cross-sectional views illustrating a method of manufacturing a transistor 130 of a semiconductor device 100 in accordance with some embodiments. The barrier material 110 is not patterned until after the formation of the sidewall spacers 116, the removal of the second sacrificial gate material 114, the formation of the metal layer, the heating of the workpiece 102, and the removal of the metal layer in these embodiments.

Figure 13:
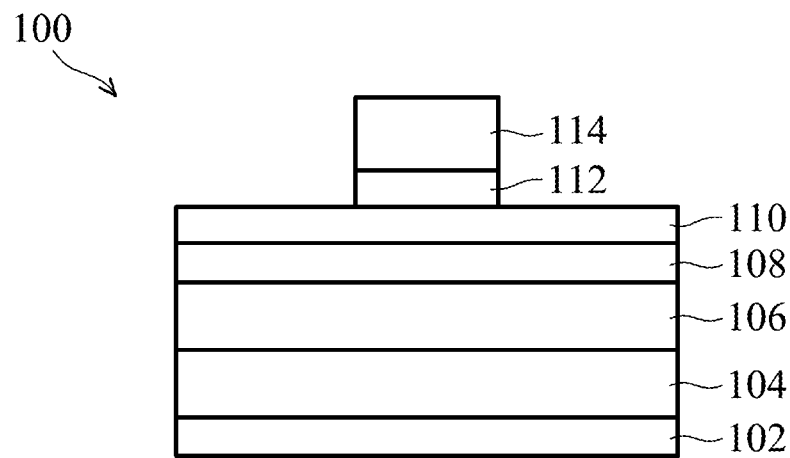
FIGS. 13 through 19 are cross-sectional views illustrating a method of manufacturing a transistor of a semiconductor device in accordance with some embodiments.
Figure 14:
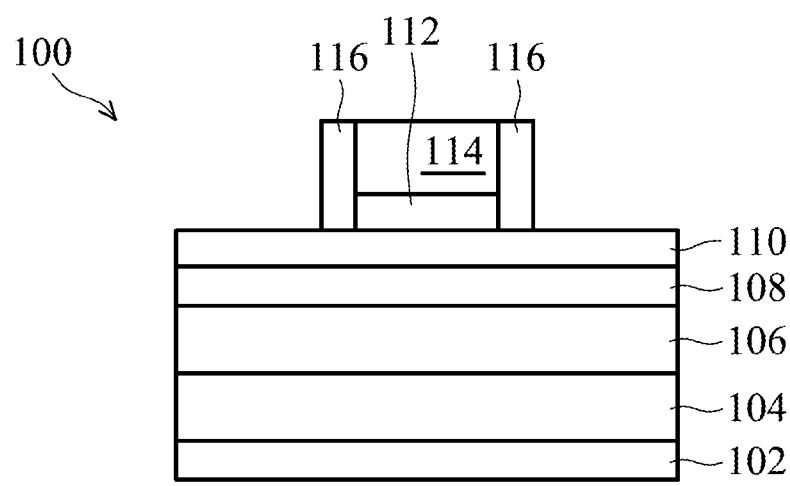
Figure 15:
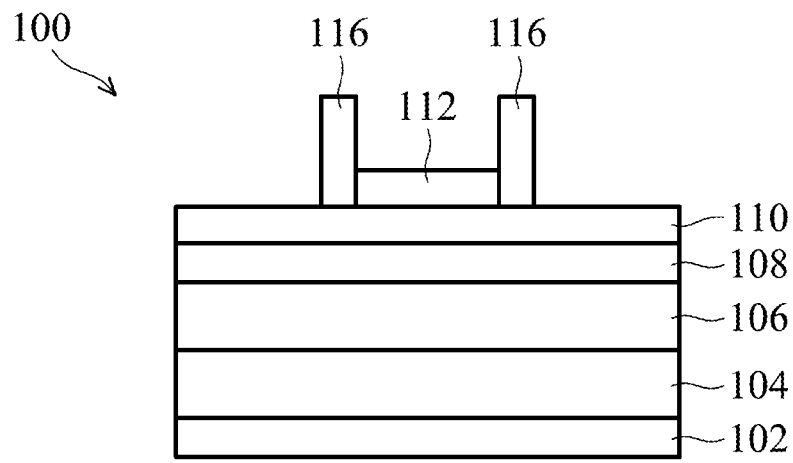
Figure 16:
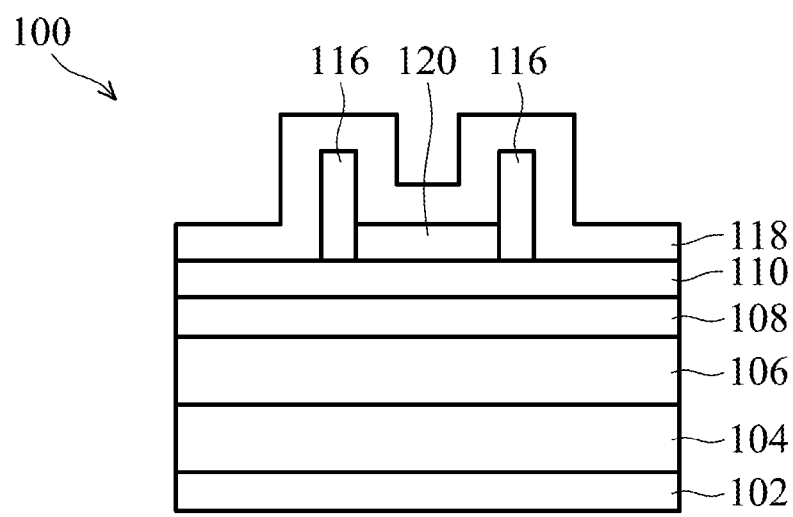

FIG. 13 illustrates the first and second sacrificial gate materials 112 and 114 after they have been patterned. Sidewall spacers 116 are formed over sidewalls of the first and second sacrificial gate materials 112 and 114 as described for FIGS. 5 and 6, and as shown in FIG. 14. The second sacrificial gate material 114 is removed, as shown in FIG. 15. The metal layer 118 is formed over the top surface of the barrier material 110, the sidewalls spacers 116, and the first sacrificial gate material 112, as shown in FIG. 16. The workpiece 102 is heated, causing the metal (Me) of the metal layer 118 to combine with the first sacrificial gate material 112 and form a gate 120 comprising a Me-III-V compound material, also shown in FIG. 16. The barrier material 110 is not adapted to react with or combine with the metal layer 118 when it is heated and remains unaffected, also shown in FIG. 16.

Figure 17:
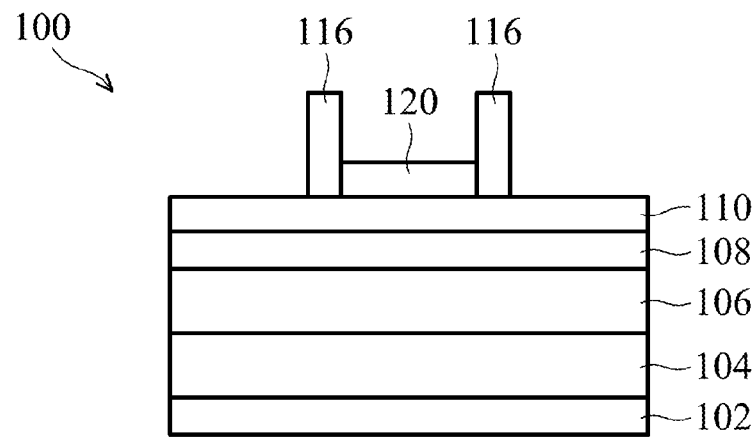
Figure 18:
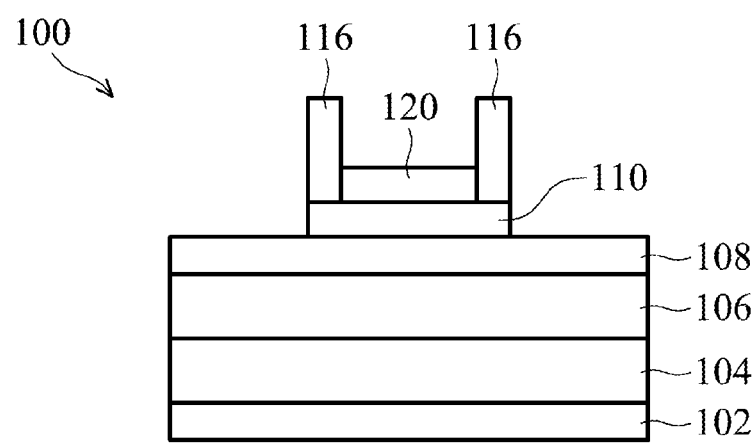

The metal layer 118 is removed, as shown in FIG. 17. The barrier material 110 is then patterned, e.g., using a selective etch process or other etch process, as shown in FIG. 18. The barrier material 110 left remaining beneath the gate 120 and sidewall spacers 116 comprises a barrier 110 of the transistor 130. Contacts are then formed that are coupled to the semiconductor channel 108. In some embodiments, the transistor 130 is covered with an oxide layer (not shown). Holes are formed in the oxide layer by lithography and a dry etch process, and the holes are subsequently filled with a contact metal, i.e., using a damascene process. A CMP process is used that is adapted to stop on the oxide layer, leaving contact plugs 124 and 126 formed in the oxide layer, comprising a material such as TiN or W. In some embodiments, prior to filling the holes with contact metal, a thin (e.g., about 4 to 10 nm) layer of a metal (such as Pt, Ni, Ti, or Au) is deposited. In some embodiments, a thermal anneal process is used to diffuse the metal into the source and drain regions 122", lowering the contact resistance between contact plugs 126 and the channel 108, forming in-diffused contact areas comprising the source and drain regions 122" as shown in FIG. 19. The III-V material 122" comprises the source and drain regions 122" of the transistor 130 and in-diffused metal atoms. The in-diffused metal may comprise Ni, Pt, Pd, Co, Pd, Au, or combinations thereof, as examples. Alternatively, the in-diffused metal may comprise other materials.

Figure 20:
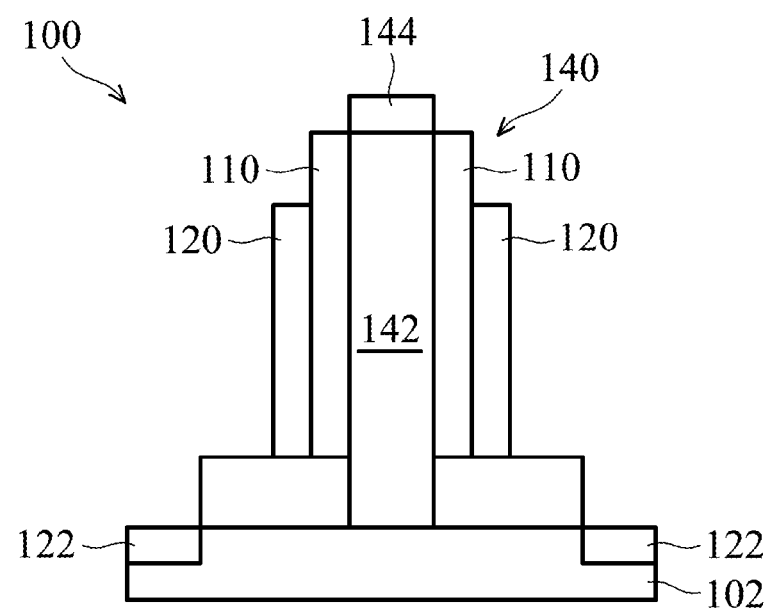
FIG. 20 is a cross-sectional view of a vertical transistor including the novel metal group III-V (Me-III-V) compound materials disposed on a source, drain, and gates of the vertical transistor in accordance with some embodiments.

Embodiments of the present disclosure are also implementable in vertical transistors. For example, FIG. 20 is a cross-sectional view of a semiconductor device 100 that includes a vertical transistor 140 including the novel metal group III-V compound materials described herein disposed on source 122 and drain 144 regions and gates 120 of the vertical transistor 140 in accordance with some embodiments. The transistor 140 comprises a vertical transistor that includes a vertical wire 142 extending from the workpiece 102, wherein the gate 120 comprises a Me-III-V compound material disposed on the side of the wire 142, around the wire 142. The wire 142 of the vertical transistor 140 has a diameter of about 4 to 40 nm that extends vertically by a dimension of about 40 to 400 nm in some embodiments from a surface of the workpiece 102. The wire 142 comprises a semiconductor material and in some embodiments comprises InAs, as an example. Alternatively, the wire 142 may comprise other dimensions and materials. A metal layer 118 (such as metal layer 118 shown in FIG. 16) is formed over the gates 112 and source and drain region 122 and 144, and the workpiece 102 is annealed to form gates 120 and source and drain regions 122 and 144 comprising a Me-III-V compound material, in accordance with some embodiments. The source and drain regions 122' and 122" described for the previous embodiments herein may alternatively be formed for the vertical transistor 140. In some embodiments, the wire 142 is grown on a substrate 102. In some embodiments, the substrate 102 comprises InAs and source region 122 comprises Me-InAs. In other embodiments, the substrate 102 comprises Si and source region 122 comprises a silicide; i.e., a Me-Si compound, e.g. NiSi or Ni$_2$Si, as another example.

Figure 21:
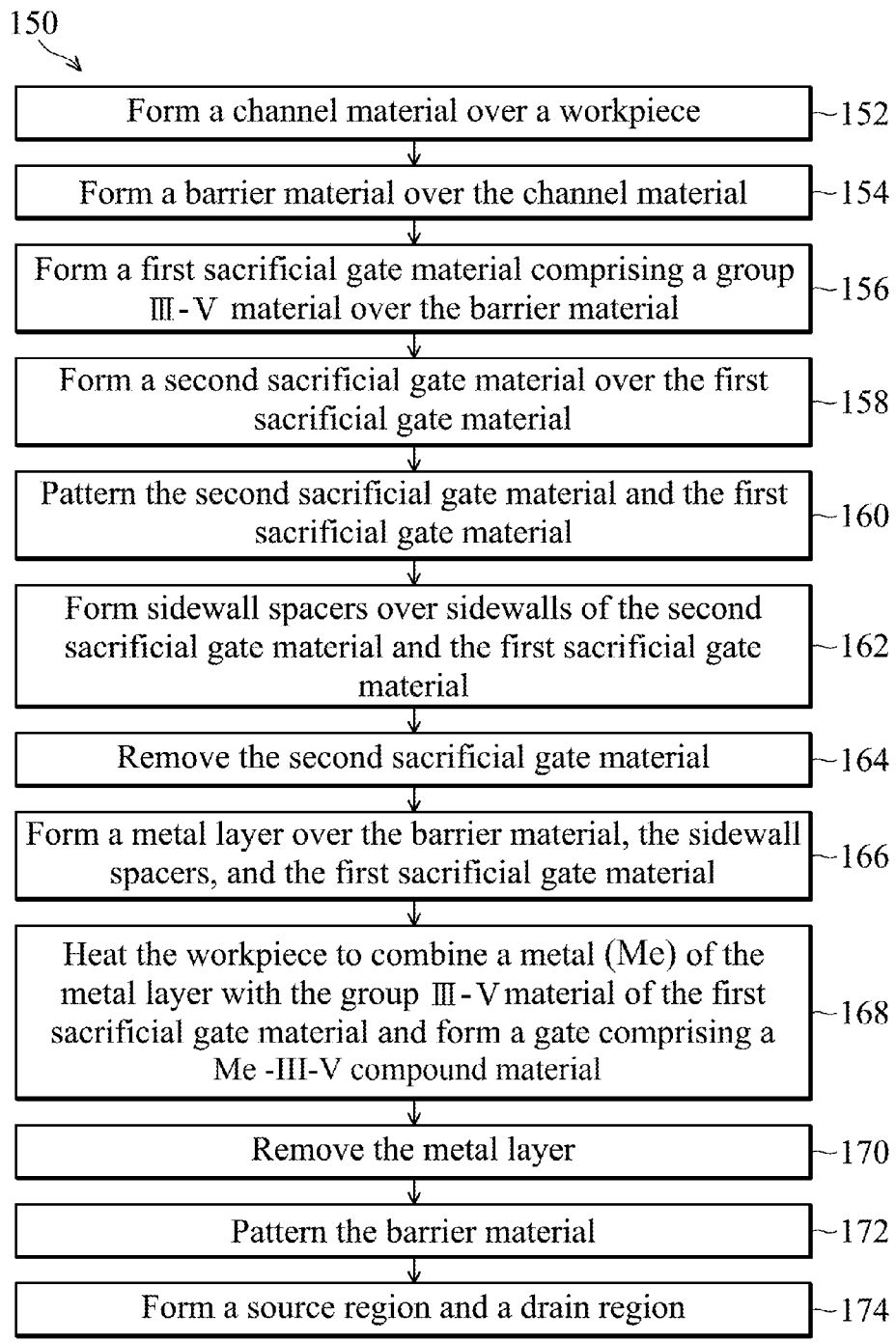
FIG. 21 is a flow chart of a method of manufacturing a transistor in accordance with some embodiments.

FIG. 21 is a flow chart 150 of a method of manufacturing a transistor 130 in accordance with some embodiments that are illustrated in FIGS. 13 through 19. In step 152, a channel material 108 is formed over a workpiece 102. In step 154, a barrier material 110 is formed over the channel material 108. In step 156, a first sacrificial gate material 112 comprising a group III-V material is formed over the barrier material. A second sacrificial gate material 114 is formed over the first sacrificial gate material 112 in step 158. The second sacrificial gate material 114 and the first sacrificial gate material 112 are patterned in step 160. In step 162, sidewall spacers 116 are formed over sidewalls of the second sacrificial gate material 114 and the first sacrificial gate material 112. The second sacrificial gate material 114 is removed in step 164. In step 166, a metal layer 118 is formed over the barrier material 110, the sidewall spacers 116, and the first sacrificial gate material 112. In step 168, the workpiece 102 is heated to combine a metal (Me) of the metal layer 118 with the group III-V material of the first sacrificial gate material 112 and form a gate 120 comprising a Me-III-V compound material. The metal layer 118 is removed in step 170, and the barrier material 110 is patterned in step 172. A source region and drain region 122 are formed in step 174.

Some embodiments of the present disclosure are combinable with embodiments of U.S. patent application Ser. No. 13/467,133, filed on May 9, 2012, entitled, "III-V compound Semiconductor Device Having Dopant Layer and Method of Making the Same," which is incorporated herein by reference. In these embodiments, prior to depositing metal layer 118, ions are implanted into the channel material 108 comprising a semiconductor material to form a dopant layer. The implanted ions form a dopant layer that extends partially into the channel material 108 or is disposed at an interface of the channel material 108 and the source and drain regions 122. The dopant layer is disposed between the channel material 108 and the source and drain regions 122, for example. When the channel material 108 is transformed into the source and drain regions 122 (or 122' or 122"), the implanted ions are pushed forward with the Me front, e.g., through a snow plow effect. The presence of the ions in the dopant layer at the interface between the source and drain regions 122 and the channel material 108 may be beneficial in some applications, because the contact resistance is reduced or the effective work function is changed, which determines the threshold voltage.

Some embodiments of the present disclosure include methods of semiconductor devices 100 and transistors 130 and 140. Other embodiments include semiconductor devices 100 and transistors 130 and 140 manufactured using the novel methods described herein.

Advantages of embodiments of the disclosure include providing novel transistors 130 and 140 and methods of manufacture thereof that have self-aligned structures and improved performance characteristics. The transistors 130 and 140 have high electron mobility and low effective mass. The transistors 130 and 140 comprise HEMTs in some embodiments that comprise self-aligned FETs with Me-III-V compound gates and source and drain regions. Masking steps are not required to form the Me-III-V gates and source and drain regions in some embodiments, advantageously. The gates and source and drain regions of the transistors 130 and 140 are low-resistive, and the gates contain no granularities. The novel methods and transistor structures and designs are easily implementable in manufacturing process flows.

In accordance with some embodiments of the present disclosure, a method of manufacturing a semiconductor device includes forming a transistor over a workpiece. The transistor includes a sacrificial gate material comprising a group III-V material. The method includes combining a metal (Me) with the group III-V material of the sacrificial gate material to form a gate of the transistor comprising a Me-III-V compound material.

In accordance with some embodiments, a method of manufacturing a transistor includes forming a channel material over a workpiece, forming a barrier material over the channel material, and forming a first sacrificial gate material over the barrier material. The first sacrificial gate material comprises a group III-V material. The method includes forming a second sacrificial gate material over the first sacrificial gate material, and patterning the second sacrificial gate material and the first sacrificial gate material. Sidewall spacers are formed over sidewalls of the second sacrificial gate material and the first sacrificial gate material, and the second sacrificial gate material is removed. A metal layer is formed over the barrier material, the sidewall spacers, and the first sacrificial gate material. The workpiece is heated to combine a metal (Me) of the metal layer with the group III-V material of the first sacrificial gate material and form a gate comprising a Me-III-V compound material. The method includes removing the metal layer, patterning the barrier material, and forming a source region and a drain region.

In accordance with some embodiments, a semiconductor device includes a transistor disposed over a workpiece. The transistor includes a channel disposed over the workpiece, a barrier disposed over the channel, and a gate comprising a Me-III-V compound material disposed over the barrier. The Me-III-V compound material of the gate comprises a metal (Me) combined with a group III-V material. The transistor includes a source region proximate a first side of the channel, and a drain region proximate a second side of the channel.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming a transistor over a workpiece, the transistor including a sacrificial gate material comprising a first group III-V material; and
    combining a metal (Me) with the first group III-V material of the sacrificial gate material to form a gate of the transistor comprising a Me-III-V compound material, wherein a topmost surface of the gate comprises the Me-III-V compound material.

2. The method according to claim 1, wherein combining the metal with the first group III-V material of the sacrificial gate material comprises combining a metal comprising a material selected from the group consisting essentially of Ni, Pt, Pd, Co, and combinations thereof.

3. The method according to claim 1, wherein combining the metal with the first group III-V material of the sacrificial gate material comprises fully nickeliding the first group III-V material of the sacrificial gate material.

4. The method according to claim 1, wherein the sacrificial gate material of the transistor comprises a first Me-III-V compound material, wherein forming the transistor comprises forming a channel material over the workpiece, a portion of the channel material being disposed beneath the sacrificial gate material and comprising a channel of the transistor, and wherein the channel material comprises a second group III-V material.

5. The method according to claim 4, wherein the method further comprises combining the metal (Me) with the second group III-V material of the channel material to form a source region and a drain region of the transistor, the source region and the drain region comprising a second Me-III-V compound material.

6. The method according to claim 4, wherein the Me-III-V compound material of the gate comprises a first Me-III-V compound material, wherein the method further comprises forming a group III-V material over a source region and a drain region of the transistor, and wherein combining the metal with the first group III-V material of the sacrificial gate material further comprises combining the metal with the second group III-V material over the source region and the drain region to form a source region and a drain region of the transistor comprising a second Me-III-V compound material.

7. The method according to claim 6, wherein forming the second group III-V material over the source region and the drain region of the transistor comprises epitaxially growing the second group III-V material over the source region and the drain region.

8. A method of manufacturing a transistor, the method comprising:
    forming a channel material over a workpiece;
    forming a barrier material over the channel material;
    forming a first sacrificial gate material over the barrier material, the first sacrificial gate material comprising a group III-V material;
    forming a second sacrificial gate material over the first sacrificial gate material;
    patterning the second sacrificial gate material and the first sacrificial gate material;
    forming sidewall spacers over sidewalls of the second sacrificial gate material and the first sacrificial gate material;
    removing the second sacrificial gate material;
    forming a metal layer over the barrier material, the sidewall spacers, and the first sacrificial gate material;
    heating the workpiece to combine a metal (Me) of the metal layer with the group III-V material of the first sacrificial gate material and form a gate comprising a Me-III-V compound material;
    removing the metal layer;
    patterning the barrier material; and
    forming a source region and a drain region.

9. The method according to claim 8, wherein the metal of the metal layer comprises a first metal, and wherein forming the source region and the drain region comprises in-diffusing a second metal into the channel material proximate the patterned barrier material.

10. The method according to claim 8, further comprising implanting ions into the channel material before forming the metal layer, wherein the implanted ions form a dopant layer disposed between the source region and the drain region and the channel material.

11. The method according to claim 8, further comprising patterning the barrier material before forming the sidewall spacers over the sidewalls of the second sacrificial gate material and the first sacrificial gate material, wherein forming the sidewall spacers further comprises forming the sidewall spacers on sidewalls of the barrier material, wherein forming the channel material comprises forming a first group III-V material, wherein forming the first sacrificial gate material comprises forming a first sacrificial gate material comprising a second group III-V material, wherein forming the metal layer further comprises forming the metal layer over the channel material, wherein heating the workpiece further comprises combining the metal (Me) of the metal layer with the first group III-V material of the channel material to form the source region and the drain region comprising a first Me-III-V compound material, and wherein heating the workpiece comprises forming a gate comprising a second Me-III-V compound material.

12. The method according to claim 8, wherein forming the second sacrificial gate material comprises forming polysilicon.

13. The method according to claim 8, further comprising, before forming the channel material over the workpiece:
    forming a template layer over the workpiece; and
    forming an insulating material over the template layer.

14. The method according to claim 13, wherein the group III-V material of the first sacrificial gate material comprises a first group III-V material, wherein forming the template layer comprises forming a second group III-V material, and wherein forming the insulator comprises forming a third group III-V material.

15. A method of manufacturing a semiconductor device, the method comprising:
    forming a III-V material transistor channel over a workpiece;
    forming a barrier layer over the transistor channel;
    patterning the barrier layer;
    forming a gate comprising a Me-III-V compound material disposed over the barrier layer, the Me-III-V compound material comprising a metal (Me) combined with a group III-V material; and
    in-diffusing a second metal into channel material proximate the patterned barrier layer to form a source region proximate a first side of the channel and a drain region proximate a second side of the channel.

16. The method of claim 15, wherein the step of forming a gate comprising a Me-III-V compound material includes fully nickeliding the group III-V material.

17. The method of claim 15, wherein the step of in-diffusing a second metal into the channel material includes in-diffusing a metal into an InAs or InGaAs material.

18. The method of claim 15, further comprising epitaxially growing a group III-V material over the source region and the drain region.

19. The method of claim 15, wherein the step of forming a gate further includes:
    forming a first sacrificial gate material over the barrier layer, the first sacrificial gate material comprising a group III-V material; and
    forming a second sacrificial gate material over the first sacrificial gate material.

20. The method of claim 15, further including disposing the Me-III-V compound material around a vertical wire extending from the workpiece.

* * * * *